United States Patent
Brown et al.

(10) Patent No.: US 7,259,678 B2
(45) Date of Patent: Aug. 21, 2007

(54) DURABLE RADIO FREQUENCY IDENTIFICATION LABEL AND METHODS OF MANUFACTURING THE SAME

(75) Inventors: Katherine A. Brown, Lake Elmo, MN (US); William C. Egbert, Minneapolis, MN (US); Jia Hu, Mounds View, MN (US); Thomas C. Mercer, Maplewood, MN (US); Terry S. Nees, Shoreview, MN (US); Fay T. Salmon, Eden Prairie, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 702 days.

(21) Appl. No.: 10/730,345

(22) Filed: Dec. 8, 2003

(65) Prior Publication Data

US 2005/0128086 A1    Jun. 16, 2005

(51) Int. Cl.
  *C08B 13/14*    (2006.01)
(52) U.S. Cl. .............................. 340/572.8; 340/572.7; 438/125; 438/126
(58) Field of Classification Search ............ 340/572.7, 340/572.8; 438/125, 126
  See application file for complete search history.

(56) References Cited

U.S. PATENT DOCUMENTS

| | | | |
|---|---|---|---|
| 4,373,163 A | 2/1983 | Vandebult | |
| 5,852,289 A | 12/1998 | Masahiko | |
| 6,058,017 A | 5/2000 | Horejs, Jr. et al. | |
| 6,100,804 A | 8/2000 | Brady et al. | |
| 6,127,989 A | 10/2000 | Kunz | |
| 6,163,260 A | 12/2000 | Conwell et al. | |
| 6,288,904 B1 | 9/2001 | Houdeau et al. | |
| 6,307,517 B1 | 10/2001 | Lee | |
| 6,424,263 B1 | 7/2002 | Lee et al. | |
| 6,482,674 B1* | 11/2002 | Kinsman | 438/125 |
| 6,486,780 B1 | 11/2002 | Garber et al. | |
| 6,613,609 B1 | 9/2003 | Laviron et al. | |
| 6,630,910 B2 | 10/2003 | Forster et al. | |
| 2003/0057536 A1 | 3/2003 | Akagawa | |
| 2003/0168514 A1 | 9/2003 | Ranclen et al. | |
| 2005/0087861 A1* | 4/2005 | Burtzlaff et al. | 438/125 |

FOREIGN PATENT DOCUMENTS

AU    2003244560 A1    10/2003

(Continued)

OTHER PUBLICATIONS

Data Sheet, EPO-TEK H70E, Epoxy Technologies, Billerica, MA, www.epotek.com, 1 page.

(Continued)

*Primary Examiner*—Jeffery Hofsass
*Assistant Examiner*—Samuel J. Walk
(74) *Attorney, Agent, or Firm*—Melissa E. Buss

(57) ABSTRACT

A durable radio frequency identification tag. A preferred embodiment of the invention provides a durable radio frequency identification tag comprising: a flexible substrate including a first major surface and a second major surface opposite the first major surface; a radio frequency identification antenna attached to the first major surface of the substrate; an integrated circuit attached to the antenna; and a thermoplastic guard attached to the flexible substrate adjacent the integrated circuit. The present invention also provides a method of manufacturing a durable radio frequency identification tag.

61 Claims, 6 Drawing Sheets

FOREIGN PATENT DOCUMENTS

| | | |
|---|---|---|
| DE | 10054873 | 5/2002 |
| JP | 2001110947 | 4/2001 |
| JP | 2003196630 | 7/2003 |
| JP | 2003196632 | 7/2003 |
| WO | WO 00/21030 | 4/2000 |
| WO | WO 01/26180 | 4/2001 |
| WO | WO 02/11094 | 2/2002 |

OTHER PUBLICATIONS

Data Sheet, EPO-TEK T7139, Epoxy Technologies, Billerica, MA, www.epotek.com, 1 page.

Information from Internet entitled, "Applications & Products", X-Indent Technology GmbH, Duren, Germany, 7 pages, printed Apr. 29, 2004, www.x-indent.com/en/prod.htm.

Document entitled, "Tag-it™ Inlays", Radio Frequency Identification Systems, Texas Instruments, Dallas, TX, 1 page, www.ti.com/tiris/default.htm.

Technical Data Sheet, Hysol® Loctite ES6010, Henkel Loctite Corporation, Rocky Hill, CT, 1 page, www.loctite.com.

Maselli, Jennifer, RFID Journal, "Syscan's compact flash reader, which plugs into almost any handheld computer, will cost $150 and read 13.56 Mhz ISO-compliant tags.", http://www.rfidjournal.com/article/articleprint/393/-1/1/(2002), 1 page, printed Feb. 16, 2004.

Article from Internet entitled, "Shock Absorbers for Smart Labels", RFID Journal, http://www.rfidjournal.com/article/articlereview/659/1/1, 2 pages, printed Nov. 24, 2003.

Information from Internet entitled, "915 MHz ID Card", Intermec, 1 page, printed Feb. 16, 2004, www.intermec.com Document entitled, "The Intermec® Guide to RFID Tag Selection", Intermec, Copyright 2003, 8 pages.

Finkenzeller, "RFID Handbook—Radio—Frequency Identification Fundamentals and Applications", 1999, pp. 151-158, 227-273, and 278-287.

* cited by examiner

DURABLE RADIO FREQUENCY IDENTIFICATION LABEL AND METHODS OF MANUFACTURING THE SAME

TECHNICAL FIELD

The present invention relates to a durable radio frequency identification tag. The present invention relates more particularly to a durable radio frequency identification tag comprising: a flexible substrate including a first major surface and a second major surface opposite the first major surface; a radio frequency identification antenna attached to the first major surface of the substrate; an integrated circuit attached to the antenna; and a thermoplastic guard attached to the flexible substrate adjacent the integrated circuit. The present invention also relates more particularly to a method of manufacturing a durable radio frequency identification tag, which includes providing a flexible substrate containing an antenna on at least one surface of the flexible substrate, attaching an integrated circuit to the antenna, and extruding a thermoplastic guard onto the substrate adjacent the integrated circuit.

BACKGROUND OF THE INVENTION

The introduction of consumer credit or debit cards with an embedded silicon integrated circuit chip, otherwise known as "smart cards," has created an interest in durable or rugged constructions for electronic devices. In fact, performance standards, such as ISO-7816-1, have been developed for smart cards to delineate resistance to mechanical stress, such as bending, torsion, and pressure stress. Typically, the smart cards are stored in a wallet or purse, and then may be inserted into card readers. When the smart card is stored in a wallet, the smart card may experience certain mechanical forces, such as bending, for example, when a person sits in a chair with the wallet containing the smart card in his back pocket. The smart card may experience other mechanical forces when it is inserted or pulled out of a card reader. The integrated circuit embedded in the smart card is typically made from brittle silicon, which may crack or break when subjected to certain mechanical forces.

Various methods have been developed to protect the integrated circuit and its connections from various mechanical forces, such disclosed in the following references: U.S. Pat. Publication 2003/0057536 A1; U.S. Pat. No. 6,613,609; U.S. Pat. No. 6,288,904; Japanese Patent Publication 2003-196630; Japanese Patent Publication 2003-196632; and Japanese Patent Publication 2001-110947. However, these types of methods are for addressing the types of mechanical forces an integrated circuit typically encounters, such as used in a smart card and stored in a wallet or used in a reader. These forces are relatively low forces, in comparison to the forces an object might encounter in an industrial setting, for example, such as impact forces from large objects or static pressure in excess of 0.5 MPa. Generally, the smart cards are kept in storage until usage and are not subjected to various environments.

SUMMARY OF THE INVENTION

One aspect of the present invention provides a durable radio frequency identification tag. The durable radio frequency identification tag comprises: a flexible substrate including a first major surface and a second major surface opposite the first major surface; a radio frequency identification antenna attached to the first major surface of the substrate; an integrated circuit attached to the antenna; and a thermoplastic guard attached to the flexible substrate adjacent the integrated circuit.

In one preferred embodiment of the above durable radio frequency identification tag, the tag further comprises a first layer of adhesive attached to the substrate. In another preferred embodiment of the above durable radio frequency identification tag, the integrated circuit has a first height measured from the first major surface of the flexible substrate, and the thermoplastic guard has a second height measured from the first major surface of the flexible substrate, and the second height is greater than the first height. In one aspect of this embodiment, the second height is at least 1.25 times larger than the first height.

In another preferred embodiment of the above durable radio frequency identification tag, the guard does not extend over the integrated circuit attached to the flexible substrate. In another preferred embodiment of the above durable radio frequency identification tag, the thermoplastic guard is comprised of a first rail and a second rail, where the first rail and second rail are substantially parallel to each other with the integrated circuit located between the first rail and second rail. In one aspect of this embodiment, the first rail and second rail are continuous lines. In one aspect of this embodiment, the first rail and second rail are discontinuous lines.

In another preferred embodiment of the above durable radio frequency identification tag, the thermoplastic guard is in the shape of an annulus, and the integrated circuit is located within the annulus. In another preferred embodiment of the above durable radio frequency identification tag, the thermoplastic guard is made from a plurality of sections, and where the sections are arranged to form a shape of an annulus, and where the integrated circuit is located within the annulus. In yet another preferred embodiment of the above durable radio frequency identification tag, the thermoplastic guard is in the shape of a polygon, and where the integrated circuit is located within the polygon. In another preferred embodiment of the above durable radio frequency identification tag, the thermoplastic guard is made from a plurality of sections, and the sections are arranged to form a shape of a polygon, and the integrated circuit is located within the polygon.

In another preferred embodiment of the above durable radio frequency identification tag, the flexible substrate has an overall thickness of between 25 microns and 100 microns. In another preferred embodiment of the above durable radio frequency identification tag, the tag further comprises a flexible cover layer attached to the thermoplastic guard and to the substrate. In one aspect of this embodiment, the tag further comprises a second layer of adhesive between the flexible cover layer and the flexible substrate. In another aspect of this embodiment, a pressure of at least at about 1 MPa is applied to the durable radio frequency identification tag adjacent the thermoplastic guard, and the integrated circuit is not damaged. In another preferred embodiment of the above durable radio frequency identification tag, the tag further comprises a liner attached to the first layer of adhesive opposite the substrate.

Another aspect of the present invention provides a tire in combination with the above durable radio frequency identification tag, where the layer of adhesive attaches the durable radio frequency identification tag to a tire. In another aspect of this embodiment, the radio frequency identification tag is attached to an outer sidewall of the tire.

Another aspect of the present invention provides a pallet in combination with the above durable radio frequency identification tag, where the first layer of adhesive attaches the durable radio frequency identification tag to the pallet.

Another aspect of the present invention provides a box in combination with the above durable radio frequency identification tag, where the first layer of adhesive attaches the durable radio frequency identification tag to the box. In another aspect of this embodiment, the durable radio frequency identification tag is attached to an outside surface of the box. In another aspect of this embodiment, the durable radio frequency identification tag is attached to an inside surface of the box.

Another aspect of the present invention provides a passport in combination with the above durable radio frequency identification tag, where the layer of adhesive attaches the durable radio frequency identification tag to the passport.

Another aspect of the present invention provides a passport in combination with the above durable radio frequency identification tag, where the durable radio frequency identification tag further comprises a flexible cover layer, and where the flexible cover attaches the durable radio frequency identification tag to the passport.

Another aspect of the present invention provides a document in combination with the above durable radio frequency identification tag, where the layer of adhesive attaches the durable radio frequency identification tag to the document.

Another aspect of the present invention provides a continuous roll of durable radio frequency tags, where a plurality of durable radio frequency tags above are attached to one another. In one aspect of this embodiment, the thermoplastic guard is comprised of a first rail and a second rail, where the first rail and second rail are substantially parallel to the length of the roll.

Another aspect of the present invention provides an alternative durable radio frequency identification tag. The durable radio frequency identification tag comprises; a flexible substrate including a first major surface and a second major surface opposite the first major surface; a radio frequency identification antenna attached to the first major surface of the substrate; an integrated circuit attached to the antenna; and a thermoplastic guard attached to the flexible substrate adjacent the integrated circuit; where the integrated circuit is not damaged when a pressure of at least 1 MPa is applied to the tag.

In one preferred embodiment of the above durable radio frequency identification tag, the integrated circuit has a first height measured from the first major surface of the flexible substrate, and where the thermoplastic guard has a second height measured from the first major surface of the flexible substrate, and where the second height is greater than the first height. In one aspect of this embodiment, the second height is at least 1.25 times larger than the first height. In another preferred embodiment of the above durable radio frequency identification tag, the guard does not extend over the integrated circuit attached to the flexible substrate. In another preferred embodiment of the above durable radio frequency identification tag, the thermoplastic guard is comprised of a first rail and a second rail, where the first rail and second rail are substantially parallel to each other with the integrated circuit located between the first rail and second rail. In another aspect of this embodiment, the first rail and second rail are continuous lines. In another aspect of this embodiment, the first rail and second rail are discontinuous lines.

In another preferred embodiment of the above durable radio frequency identification tag, the thermoplastic guard is in the shape of an annulus, and where the integrated circuit is located within the annulus. In another preferred embodiment of the above durable radio frequency identification tag, the thermoplastic guard is made from a plurality of sections, and where the sections are arranged to form a shape of an annulus, and where the integrated circuit is located within the annulus. In another preferred embodiment of the above durable radio frequency identification tag, the thermoplastic guard is in the shape of a polygon, and where the integrated circuit is located within the polygon. In another preferred embodiment of the above durable radio frequency identification tag, the thermoplastic guard is made from a plurality of sections, and where the sections are arranged to form a shape of a polygon, and where the integrated circuit is located within the polygon. In another preferred embodiment of the above durable radio frequency identification tag, the flexible substrate has an overall thickness of between 25 microns and 100 microns.

In another preferred embodiment of the above durable radio frequency identification tag, the tag further comprises a first layer of adhesive attached to the substrate. In one aspect of this embodiment, the tag further comprises a liner attached to the first layer of adhesive opposite the substrate. In yet another preferred embodiment of the above durable radio frequency identification tag, the tag further comprises a flexible cover layer attached to the thermoplastic guard and to the flexible substrate. In another preferred embodiment of the above durable radio frequency identification tag, the tag further comprises a second layer of adhesive between the flexible cover layer and the flexible substrate.

Another aspect of the present invention provides a tire in combination with the above durable radio frequency identification tag, where the layer of adhesive attaches the durable radio frequency identification tag to a tire. In another aspect of this embodiment, the radio frequency identification tag is attached to an outer sidewall of the tire.

Another aspect of the present invention provides a pallet in combination with the above durable radio frequency identification tag, where the first layer of adhesive attaches the durable radio frequency identification tag to the pallet.

Another aspect of the present invention provides a box in combination with the above durable radio frequency identification tag, where the first layer of adhesive attaches the durable radio frequency identification tag to the box. In another aspect of this embodiment, the durable radio frequency identification tag is attached to an outside surface of the box. In another aspect of this embodiment, the durable radio frequency identification tag is attached to an inside surface of the box.

Another aspect of the present invention provides a passport in combination with the above durable radio frequency identification tag, where the layer of adhesive attaches the durable radio frequency identification tag to the passport.

Another aspect of the present invention provides a document in combination with the above durable radio frequency identification tag, where the layer of adhesive attaches the durable radio frequency identification tag to the document.

Another aspect of the present invention provides a method of manufacturing a durable radio frequency identification tag. The method comprises the steps of: providing a flexible substrate containing an antenna on at least one surface of the flexible substrate; attaching an integrated circuit to the antenna; and extruding a thermoplastic guard onto the substrate adjacent the integrated circuit. In one preferred embodiment of the above method, the method further comprises the step of: forming a roll of durable radio frequency tags, which the flexible substrate with antennae and attached integrated circuits form a continuous roll. In another preferred embodiment of the above method, the extruding step includes extruding a thermoplastic guard comprising at least two rails in a direction parallel to the direction of unwinding and winding of the roll. In yet another preferred embodiment of the above method, the method further includes the step of: applying a layer of adhesive on the flexible substrate. In one aspect of this method, the method further includes the step of: providing a liner and attaching the durable radio frequency identification tag to the liner with the layer of adhesive. Another aspect of the present invention provides a durable radio frequency identification tag made by the above method.

BRIEF DESCRIPTION OF THE DRAWINGS

The present invention will be further explained with reference to the appended Figures, wherein like structure is referred to by like numerals throughout the several views, and wherein.

DETAILED DESCRIPTION OF THE INVENTION

Figure 1:
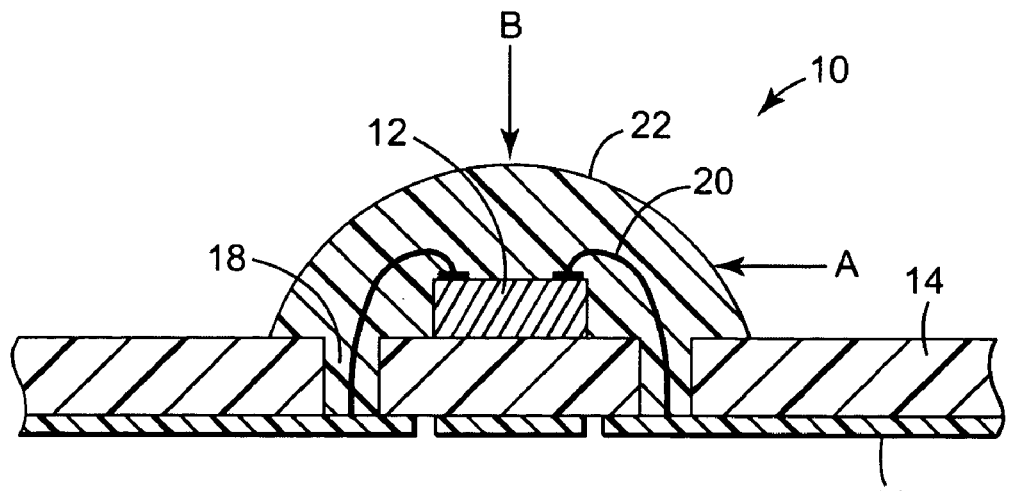
FIG. 1 is a cross-sectional diagram illustrating a prior art method for protecting an integrated circuit.

Various methods have been developed to help protect a sensitive integrated circuit in a smart card from environmental factors, including mechanical stress. One prior art method is illustrated in FIG. 1. In this method, a thermal- or radiation-cured compound encapsulates the integrated circuit. This method is common in smart cards or other general consumer electronics, such as watches, clocks, toys, or calculators. FIG. 1 illustrates a prior art method as applied in a smart card 10 including a dielectric support sheet 14 and an integrated circuit 12. The integrated circuit 12 is glued to the dielectric support sheet 14. The dielectric support sheet 14 is disposed on a contact grid 16, such as a metal plate made of nickel-plated and gold-plated copper, for example. Connection wells 18 are made in the dielectric support sheet 14 to allow connecting wires 20 to connect the contact pads of the integrated circuit 12 to the contact areas of the grid 16. A protection or encapsulation step protects the integrated circuit 12 and the soldered connecting wires 20. This technique is often referred to as "glob top," which designates the coating of the integrated circuit from the top using an encapsulation material 22. Alternatively, the encapsulation material may be localized and held in place by a frame or mold. The result is a characteristic mound of encapsulation material that looks similar to a "glob," and hence, resulted in the nickname "glob top" for this process in the industry. The "glob top" process results in a mound of material that overlays the integrated circuit to be protected, as illustrated in FIG. 1. One example of a radio frequency identification ("RFID") tag using a similar encapsulation or "glob top" method to protect the integrated circuit is commercially availably from Intermec Corporation based in Everett, Wash., under the trade name INTELLITAG. Another example of an encapsulation or "glob top" method is disclosed in U.S. Pat. No. 6,613,609, "Method for Producing a Portable Electronic Device with an Integrated Circuit Projected by a Photosensitive Resin."

The encapsulation material or "glob top" material may include thermosetting or curable materials, such as curable epoxies or silicones. The application of the encapsulation material 22 may be accomplished by extrusion or flow through a nozzle, a needle, or by screen, stencil, or transfer printing of a paste-like precursor when using of a curable compound. The encapsulation material may be cured in place by thermal or actinic radiation.

One disadvantage of the encapsulation approach or "glop top" approach is illustrated in FIG. 1. The mound of encapsulation material 22 above the integrated circuit 12 creates the high point above the plane of the dielectric support sheet 14. The high point of the encapsulation material is generally situated directly above the integrated circuit 12 to be protected. This high point of the encapsulation material 22 will be the first point to encounter a normal force, designated by arrow B, as may be applied by a second object. It is believed that the encapsulation material will concentrate the normal force B at the location of the integrated circuit 12 and cause the normal force B to be transmitted through the integrated circuit 12 into the substrate 14 below, instead of protecting the integrated circuit 12 from the normal force B. This is undesirable. If the integrated circuit 12 under the encapsulation material 22 is a relatively fragile and brittle silicon integrated circuit, the concentrated force may cause mechanical stress to the integrated circuit, and most likely lead to failure by cracking or fracture. Instead of protecting the integrated circuit, it is believed that the encapsulation process or "glob top" process actually increases the probability that the integrated circuit 12 will encounter mechanical stress, causing it to crack or fracture, and thus fail during use.

Another disadvantage of the encapsulation approach or "glop top" approach is illustrated in FIG. 1, which is similar to the disadvantage described above. When shear forces, designated by arrow A, are applied parallel to the plane of the dielectric support sheet 14, the high point of encapsulation material intercepts the shear force A. A second object moving parallel to the dielectric support sheet 14 may create such shear forces. It is believed that some portion of the shear forces is transferred through the encapsulation material 22 to the interface between the integrated circuit 12 and the dielectric support sheet 14. If the integrated circuit 12 is connected to the dielectric support sheet 14 by wire bond (as illustrated in FIG. 1) or by alterative processes, such as flip chip, solder ball grid array, anisotropic conductive film adhesive, conductive paste or similar materials, the electrical connections in the boundary region between the integrated circuit 12 and the dielectric support sheet 14 will be stressed by the lateral shear forces A transmitted through the encapsulation material 22. The lateral stress may strain one or more of the connections between the integrated circuit 12, the contact grid 16, and the dielectric support sheet 14 to the breaking point, causing the integrated circuit and its affiliated connections in the smart card 10 to fail. In other words, the smart card would not be readable by an interrogator.

Figure 2:
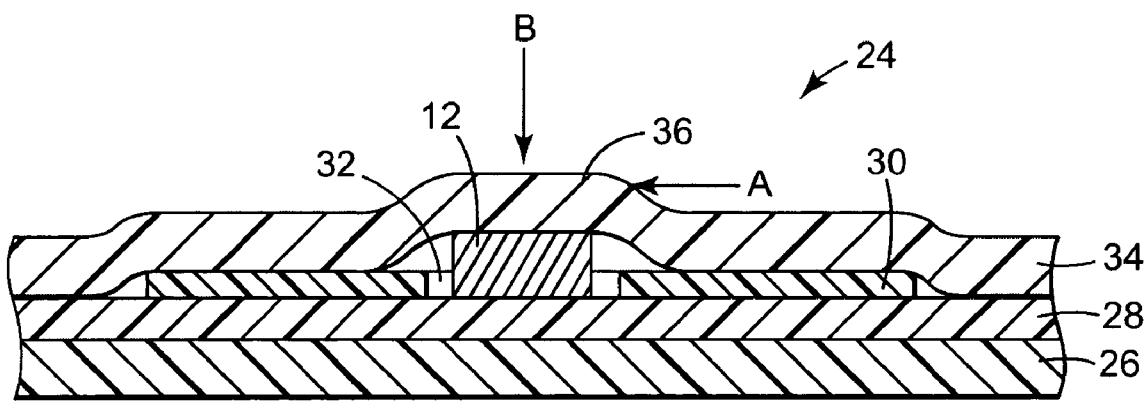
FIG. 2 is a cross-sectional diagram illustrating another prior art method for protecting an integrated circuit.

Another prior art method developed to help protect the sensitive integrated circuit chip in the smart card from mechanical stress is illustrated in FIG. 2. In this method, the integrated circuit 12 is embedded inside the smart card 24 between a variety of layers, including one layer with a hole or aperture cut into the layer. Typically, these various layers are made of polymers or paper. In this prior art smart card 24, the antenna 28 is attached to a polymer or paper substrate 26, with the integrated circuit 12 attached to the antenna 28 opposite the substrate 26. A polymer or paper film 30 with a hole or aperture 32 is typically laminated to the antenna 28 and the substrate 26, with the hole 32 centered around the integrated circuit 12. A cover layer 34 is typically laminated to the antenna 28 and the aperture film 30. The film 30 with the hole 32 supposedly is intended to absorb the stress created by normal force, designated by arrow B, or shear force, designated by arrow A, so that some of the stress bypasses the integrated circuit 12. The aperture film 30 supposedly distributes normal forces B over the area of smart card 24, except in the aperture 32. Under shear forces A, the aperture film 30 distributes the lateral shear force over the relatively large interface area between the aperture film 30 and the substrate 28. One example of a smart card using an aperture method to protect the integrated circuit is commercially availably from X-Ident Technology GmbH, based in Düren, Germany, under the trade name IQ-PAPER. Another example of an aperture film method is disclosed in published U.S. Pat. Application No. U.S. 2003/0057536 A1, "Non-Contact Type IC Card."

One disadvantage of the aperture film approach is the necessity to align the aperture 32 in the film 30 relative to the substrate 26, so that the integrated circuit 12 lies in the middle of the aperture 32 without contacting the sidewalls of the aperture 32 in the film 30. This construction may be difficult to achieve when manufacturing. To maintain the location of the aperture 32 relative to the location of the integrated circuit 12, it requires active control of the relative position and speed of both films 30, 26 during the lamination process, so that the integrated circuit 12 is always located within the open area of the aperture 32. The aperture 32 may be cut in the film 30 to allow a small gap, such as 0.5 to 1 mm, between the edge of the integrated circuit 12 and the edges of the aperture 32. If the length of one web of film happens to shrink during lamination as little as 0.05% compared to the length of the other web of film (for example, 25 µm shrinkage over a 50 mm length smart card 24), the two film webs 30, 26 will go out of alignment within 20 to 40 down-web repeat units, such that the integrated circuit 12 will not be located wholly within the aperture 32. Roll-to-roll lamination of the two webs of film 30, 26 in alignment can be accomplished, but it requires active correction of the relative speed and position of one web compared to the other web to maintain the alignment for web lengths of 50 to 100 meters or more, which may lead to extra costs during manufacturing. Lamination of the two webs of film 30, 26, on a sheet-by-sheet basis, removes the effects of accumulating error, but there is still the requirement for alignment of the aperture film to the integrated circuit 12, which also results in extra costs during manufacturing.

Another disadvantage of the aperture film approach is evident when the aperture film 30 is not as thick as the integrated circuit 12 it is intended to protect, as illustrated in FIG. 2. In this case, the aperture film 30 and its laminating adhesive (if any) are smaller in overall height in comparison to the overall height of the integrated circuit 12 and the substrate integrated circuit attach pads (if any). The upper surface of the integrated circuit 12 will protrude above the plane of the aperture film 30. As a result, the mound 36 where the cover layer 34 covers the integrated circuit 12 is the high point of the construction, and as with the encapsulation approach described above, this high point of the cover layer 34 directly above the integrated circuit 12 will be first area to encounter a normal force, designated by arrow B, as may be applied by a second object. It is believed that the normal force B will concentrate at the location of the integrated circuit 12. The stress upon the integrated circuit 12 may in turn lead to failure of the integrated circuit 12 by fracture or cracking. Likewise, when shear forces, designated by arrow A, are applied parallel to the plane of the substrate 26, the high point of cover layer 34 directly above the integrated circuit 12 intercepts the shear force A. A second object or container moving parallel to the cover layer 34 may create such shear forces. It is believed that some portion of the shear forces is transferred through the cover layer 34 directly above the integrated circuit 12 to the interface between the integrated circuit 12 and the substrate 26. The electrical connections in the boundary region between the integrated circuit 12, the antenna 28, and the substrate 26 will be stressed by the lateral shear forces A transmitted through the cover layer 34. The lateral stress can strain one or more of the connections between the integrated circuit 12, antenna 28, and substrate 26 to the breaking point, causing the integrated circuit or its affiliated connections in the smart card 10 to fail. In other words, the smart card would not be readable by an interrogator.

Lastly, another prior art method for protecting an integrated circuit is disclosed in Japanese Published Patent Application 2003-196632. However, the use of such processes such as screen-printing, stencils or masks in combination with curable materials is not readily adapted to rapid, roll-to-roll manufacturing, for example, in the case of mass-producing RFID tags.

All of the prior art methods mentioned above are mostly directed at addressing the types of mechanical forces a smart card typically encounters, such as when stored in a wallet or used in a reader. These forces are relatively low forces, in comparison to the forces an object might encounter in an industrial setting, for example, such as impact forces from large objects or static pressure in excess of 0.5 MPa. Generally, the smart cards are kept in storage until usage and are not subjected to various environments.

Recently, there has been a need to use radio frequency identification tags in industrial and other demanding environments, for example for use on tires, cartons, crates, or pallets. In any of these examples, the integrated circuits in the radio frequency identification tags are subjected to forces much greater than the forces the typical smart card encounters. For example, as the tires are shipped or stored, they may be thrown against each other or stacked. A radio frequency identification tag mounted on the sidewall of the tire will experience large mechanical forces against it in either of these conditions. As another example, the radio frequency tags may be mounted outside of the pallets or crates, and a fork truck may be used to move the pallets or crates within the warehouse. The fork truck or other pallets or crates may create large forces on the radio frequency tag when they come into contact with the tag. Moreover, the radio frequency tags will be subject to various environments and forces as the objects they are attached to are moved. In contrast, the smart cards are not applied to other objects that may be moved from location to location. As a result, the prior art approaches for protecting the integrated circuits in smart cards or other electronic devices do not typically work because of the larger mechanical forces and various environments the radio frequency tags are subjected to in industrial environments. Therefore, it is desirable to provide a durable or rugged radio frequency tag that is useful in industrial environments or other demanding environments that is easy and cost effective to manufacture.

In industrial applications, RFID tags may be used on disposable packaging, such as cartons or boxes, and may add directly to manufacturing costs. Therefore, it is advantageous in such cases to have cost-effective RFID tags. In contrast, smart cards are used multiple times over several years, and as a result, can tolerate a higher initial cost.

Figure 3:
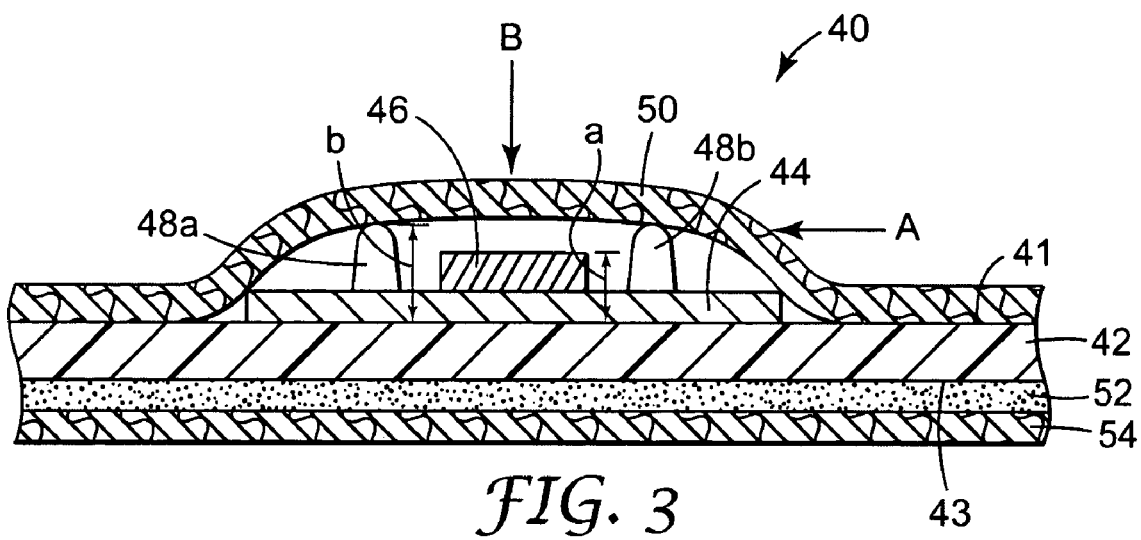
FIG. 3 is a cross-sectional diagram illustrating one embodiment of the durable radio frequency identification tag of the present invention.
Figure 4:
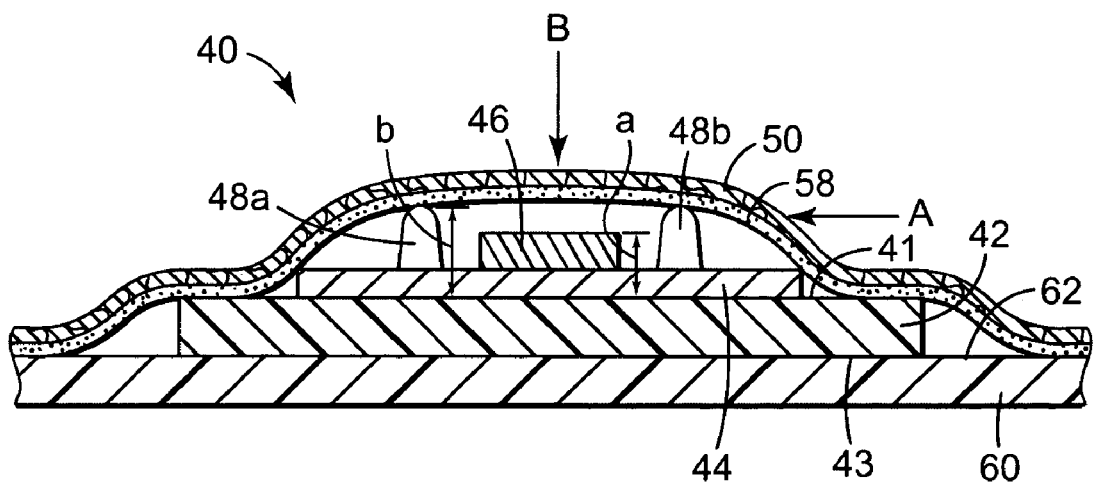
FIG. 4 is a cross-sectional diagram illustrating another embodiment of the durable radio frequency identification tag of the present invention.

The durable radio frequency identification ("RFID") tag of the present invention was developed to overcome some of the disadvantages illustrated above. FIGS. 3 and 4 illustrate two embodiments of the durable RFID tag 40 of the present invention. The durable RFID tag 40 includes a substrate 42 having a first major surface 41 and a second major surface 43 opposite the first major surface 41. Preferably the substrate 42 is a flexible substrate, such that it could be used in a label that may be wrapped around an object. The flexible substrate 42 should have enough flexibility to conform to a variety of surfaces and bend easily around corners. For example, the substrate 42 is preferably in the range of 25–100 microns in thickness, and is made of a flexible material, such as polyester, polyethylene naphthanate, polyimide, polypropylene, paper, or other flexible materials apparent to those skilled in the art.

An RFID element is attached to the first major surface 41 of the substrate 42. The RFID element typically includes two components: an integrated circuit 46 and an antenna 44. The integrated circuit 46 provides the primary identification function. It includes software and circuitry to permanently store the tag identification and other desirable information, interpret and process commands received from the interrogation hardware, respond to requests for information by the interrogator, and assist the hardware in resolving conflicts resulting from multiple tags responding to interrogation simultaneously. Optionally, the integrated circuit may provide for updating the information stored in its memory (read/write) as opposed to just reading the information out (read only). Integrated circuits suitable for use in RFID tags 40 include those available from Texas Instruments (in their TIRIS or TAG-IT line of products), Philips (in their I-CODE, MIFARE and HITAG line of products), among others.

Figure 5:
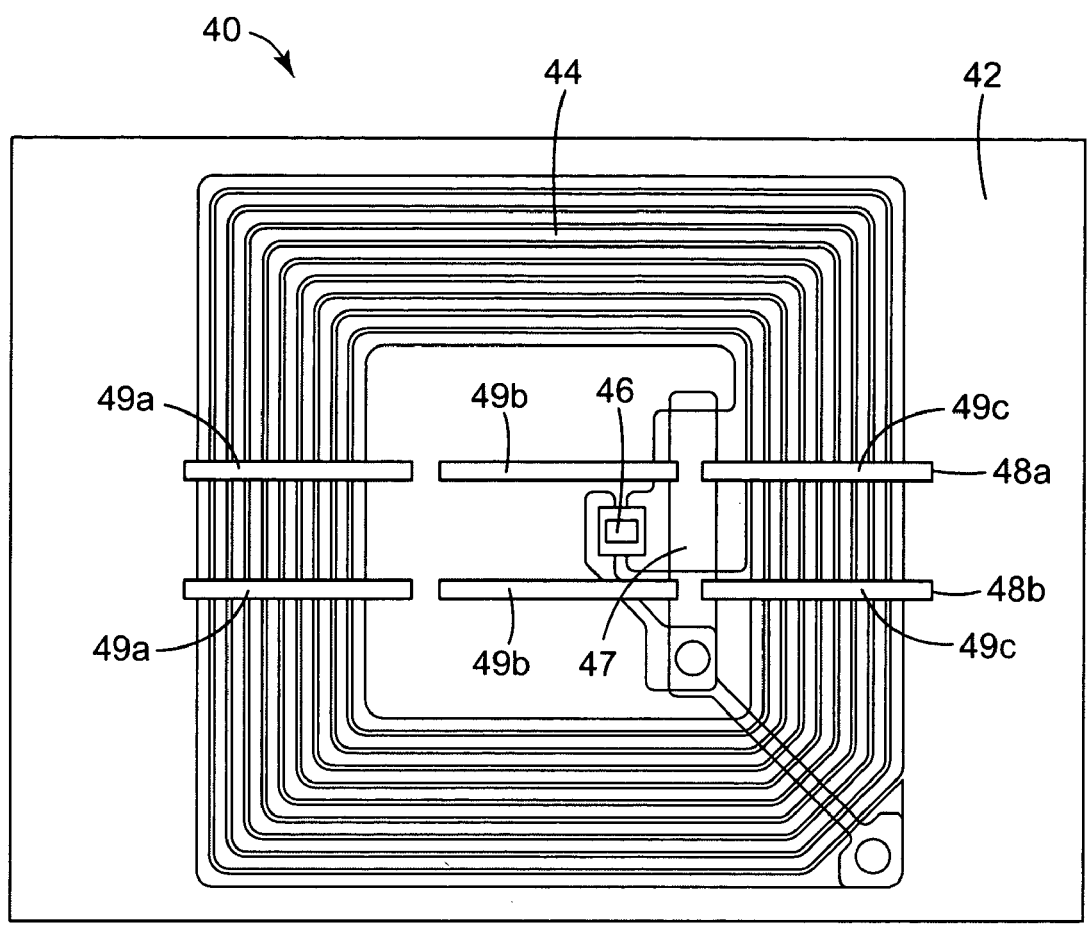
FIG. 5 is a top view of the durable radio frequency identification tag of FIG. 3, with the cover layer removed for clarity.
Figure 6:
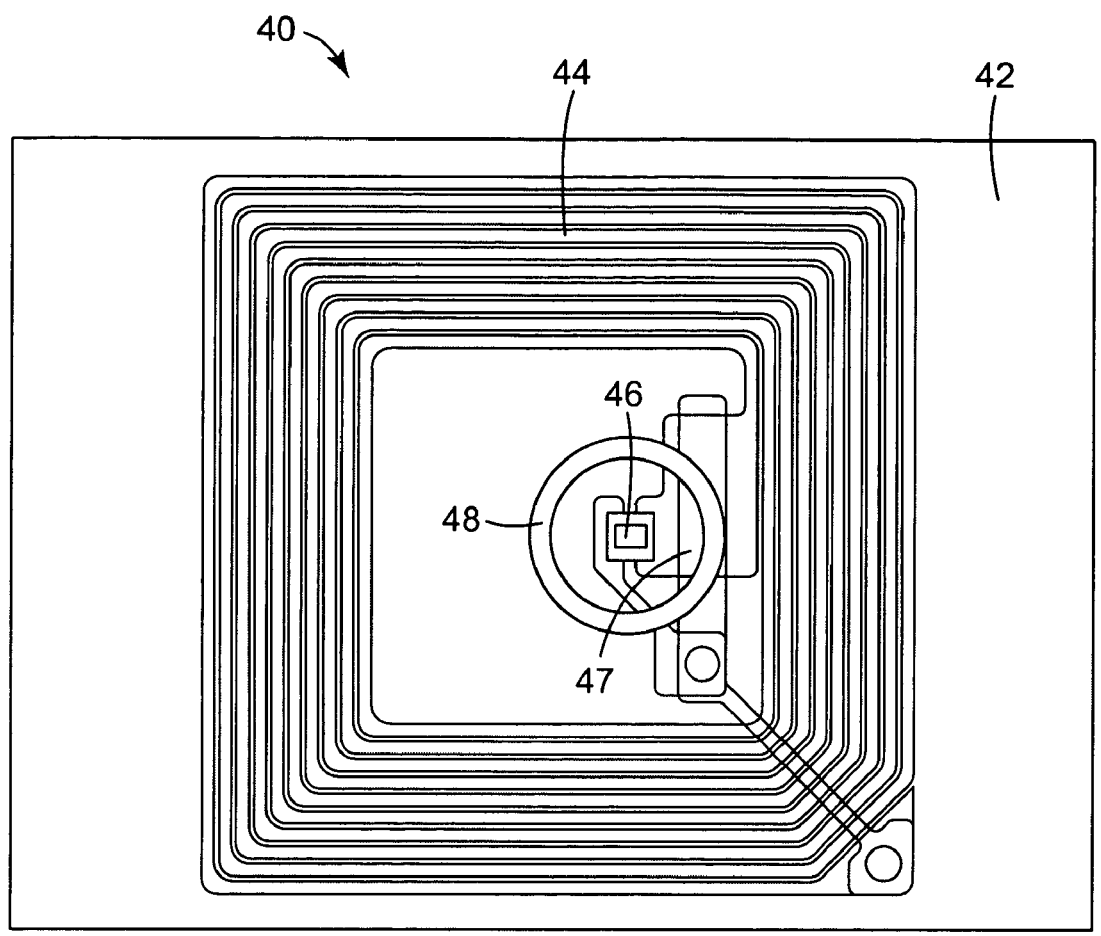
FIG. 6 is a top view of one embodiment of an alternative radio frequency identification tag of the present invention.
Figure 7:
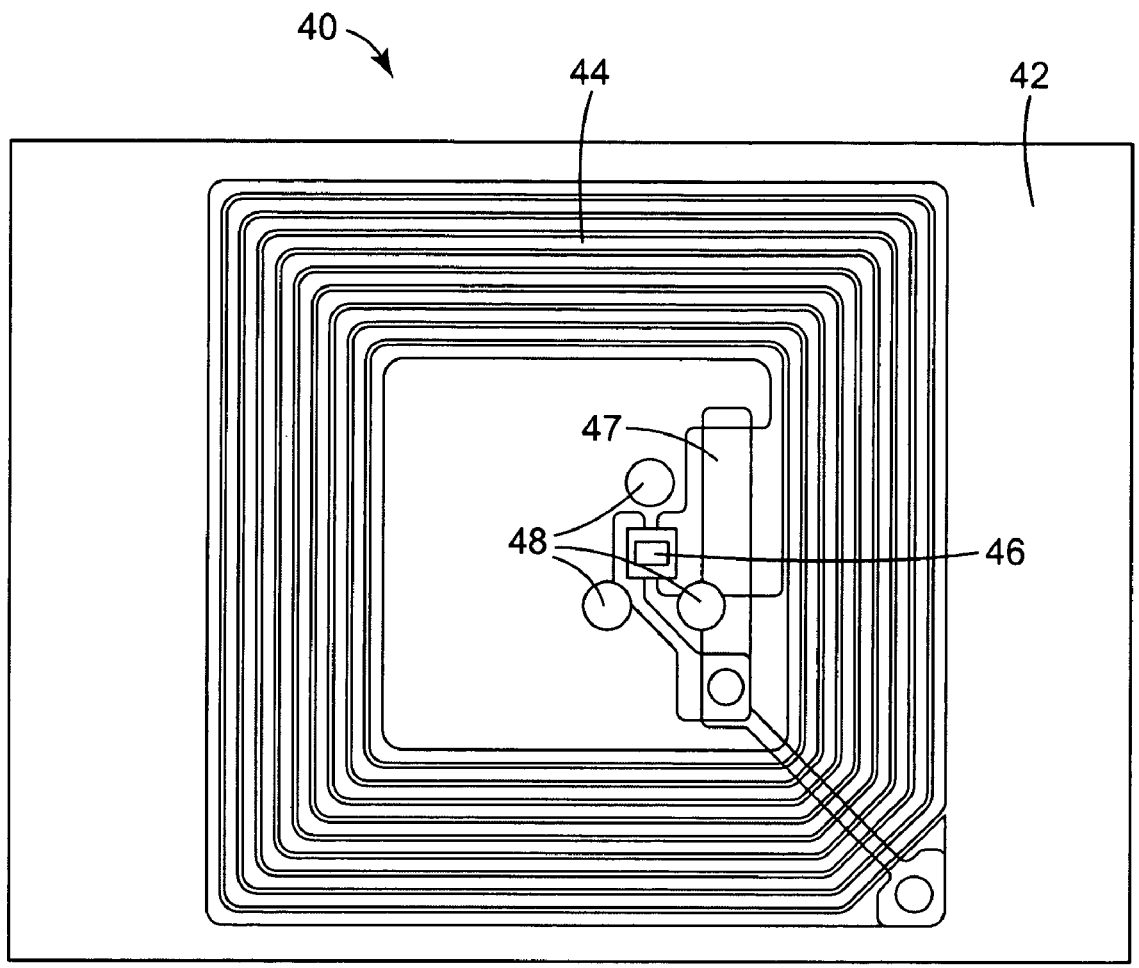
FIG. 7 is a top view of one embodiment of another alternative radio frequency identification tag of the present invention.

The antenna 44 geometry and properties depend on the desired operating frequency of the RFID tag 40. For example, 915 MHz or 2.45 GHz RFID tags 40 would typically include a dipole antenna, such as a linear dipole antenna or a folded dipole antenna. A 13.56 MHz (or similar) RFID tag 40 would use a spiral or coil antenna 44, as shown in FIGS. 5–7. However, other antenna designs are known to those skilled in the art. In either case, the antenna 44 intercepts the radio frequency energy radiated by an interrogation source. This signal energy carries both power and commands to the tag 40. The antenna enables the RF-responsive element to absorb energy sufficient to power the integrated circuit 46 and thereby provide the response to be detected. Thus, the characteristics of the antenna must be matched to the system in which it is incorporated. In the case of tags operating in the high MHz to GHz range, the most important characteristic is the antenna length. Typically, the effective length of a dipole antenna is selected so that it is close to a half wavelength or multiple half wavelength of the interrogation signal. In the case of tags operating in the low to mid MHz region (13.56 MHz, for example) where a half wavelength antenna is impractical due to size limitations, the important characteristics are antenna inductance and the number of turns on the antenna coil. For both antenna types, good electrical conductivity is required. Typically, metals such as copper or aluminum would be used, but other conductors, including printed inks, are also acceptable. It is also important that the input impedance of the selected integrated circuit match the impedance of the antenna for maximum energy transfer. Additional information about antennas is known to those of ordinary skill in the art from, for example, reference texts such as K. Finkenzeller, "RFID Handbook. Radio-Frequency Identification Fundamentals and Applications," (1999 John Wiley & Sons Ltd, Chichester, West Sussex, England).

A capacitor 47 (shown in FIGS. 5–7) is often included to increase the performance of the RFID tag 40. The capacitor 47, when present, tunes the operating frequency of the tag to a particular value. This is desirable for obtaining maximum operating range and insuring compliance with regulatory requirements. The capacitor may either be a discrete component, or integrated into the antenna.

The durable RFID tag 40 includes at least one guard 48 adjacent the integrated circuit 46 to help protect the integrated circuit 46 from forces applied to the RFID tag 40. The guards 48 are placed proximate to, but not overlying, the integrated circuit 46 on an RFID tag 40. The guards 48 help divert normal forces, designated by arrow B, and shear forces, designated by arrow A, away from the integrated circuit 46 and into the underlying substrate 42. By diverting normal and shear forces away from the integrated circuit 46 on the RFID tag 40, the guards 48 help prevent failure of the RFID tag 40 caused by stress-induced fracture or cracking of the integrated circuit 46, or by shear-induced damage or disruption of the electrical connection between the integrated circuit 46 and the antenna 44, or a combination of both damage mechanisms. The guards 48 of the durable RFID tag 40 will help resist damage from one or both of these damage mechanisms that would otherwise render inoperable the prior art RFID tags, as illustrated by the Examples below. Although the forces A and B are illustrated as single arrows, such forces are distributed over the area of the guard structure 48. In addition, the guards 48 may help protect other discrete components of the RFID tag, such as capacitors or batteries.

Preferably, the RFID tag 40 includes two guards 48a, 48b. These guards 48a, 48b may be two parallel rails, as illustrated in FIG. 5. If the RFID tags 40 are in a roll form, it is preferable that the rails are parallel to the direction of the roll for ease of manufacturability. However, the guard 48 may have any other shape or form, or may be made from a plurality of portions, as illustrated in FIGS. 6–7.

More preferably, the guards 48a, 48b have a relative height that is equal to or greater than the height of the integrated circuit 46. For example, the height of the guards 48a, 48b, as measured from the first major surface 41 of the substrate 42 (designated by distance b), should be greater than the height of the integrated circuit 46, as measured from the first major surface 41 of the substrate 42 (designated by distance a). Both heights are measured in a direction perpendicular to the first major surface 41 of the substrate 42. This arrangement helps provide the guards 48a, 48b as a high point of the RFID tag 40, which helps to intercept the application of a force B applied approximately normal to the plane of the RFID tag 40 and helps to intercept the application of a force A applied approximately parallel to the plane of the RFID tag 40. The arrangement also helps to provide a high point of the guards 48 that do not overlay the integrated circuit 46 that the guards 48 are meant to protect.

The height of the guards 48 should be at least 1.1 times the height of the integrated circuit 46, preferably at least 1.25 times as high, and most preferably at least 1.5 times the height of the integrated circuit in a direction approximately perpendicular to the plane of the substrate. Heights for distance a, the height of the integrated circuit 46 preferably range from 50 microns to 500 microns, and more preferably range from 150 microns to 300 microns. Heights for distance b, the height of the guards 48 preferably range from 55 microns to 2000 microns, and more preferably range from 188 microns to 750 microns. The guards 48 should be located from the integrated circuit 46 preferably within a range of 1 mm to 7.5 mm, and more preferably range from 2 mm to 5 mm. The length of the guards, if they are positioned as two rails on either side of the integrated circuit, range from about 5 mm to the full length of the RFID tag in the machine direction, preferably about 5 mm to 15 mm.

The RFID element including the integrated circuit 46 and the antenna 44 illustrated in FIGS. 3 and 4 represents a construction typical of many commercially available RFID elements, wherein the integrated circuit 46 is attached with a conductive adhesive directly to the metal attach pads of the antenna 44 on a substrate typically made of polyester. However, the integrated circuit 46 may be attached to an interposer, such as a bridge or other flexible substrate, and the interposer may then be attached to the antenna 44. In this example, the height of the guards 48 measured from the first surface 41 of the substrate 42 in a direction approximately perpendicular to the substrate 42 will preferably be greater than the height of the combined thickness of the integrated circuit 46 and the interposer measured from the first surface 41 of the substrate 42 to provide adequate protection to the integrated circuit 46. Similarly, the integrated circuit 46 may be embedded or partially embedded in a receptor site in the substrate 42, and the receptor site is in turn connected to the RFID antenna 44. In this example, the thickness of the integrated circuit 46 and its affiliated components is essentially equal to or greater than the thickness of the surrounding antenna 44, these constructions will benefit from the guards 48 as well. The guards 48 will protect the integrated circuit 46 in its receptor site from normal force and shear load forces.

The guards 48 are preferably made of thermoplastic materials. Suitable thermoplastic materials include ethylene-vinyl acetate copolymers, polyamides, and polyesters. However, the guards 48 may be made of other materials.

One of the advantages of using thermoplastic materials for the guards 48 is that thermoplastic polymers are very easy to handle in manufacturing environments. Thermoplastic polymers are particularly easy to handle, as compared to thermoset polymers or other curable materials. Thermoset polymers or other curable materials undergo a chemical reaction to increase molecular weight and/or cause the formation of polymer crosslinks, and are made of, for example, polymers containing reactive groups and/or reactive oligomers or monomers, or numerous other formulations that are known to those skilled in the art. These thermosetting materials must be protected from conditions that will cause them to cure before use, and such materials may also require special processing steps to cause them to cure when desired, such as the application of heat, ultraviolet lights, and the like. Curing steps are also usually slow, and if thermosetting materials are formulated for rapid curing, then the requirements for careful storage and handling become more difficult. Because of the ease of handling thermoplastics polymers, they are often used to make "hot-melt" adhesives, which are widely used in such applications as the assembly of cartons and furniture. However, thermoset polymers are often used in applications where there are higher performance requirements, such as high temperature stability or high adhesive requirements, which can only be met with the use of cured materials (that is, materials that have chemical crosslinks and/or a three-dimensional chemical network). It was found that the guards 48 of the present invention, when made from thermoplastic materials, achieved a high level of performance (durability or ability to withstand pressures of at least 1 MPa) and that thermoplastic materials were easily handled and processed.

Another advantage of using thermoplastic polymers for the guards 48 is that they may be heated to a temperature where they can flow, which is especially suitable for continuous processing, particularly extrusion onto a substrate which is moving at a constant speed. This is an advantage useful for making the durable RFID tags 40 in continuous roll form. Thermoplastic polymers can be extruded in various sizes and shapes, depending on such variables as, for example, the size and shape of the nozzle or tool, the pressure of extrusion, the temperature of extrusion and the speed of the moving substrate. Thermoplastic polymers can be rapidly processed, that is, they harden to a point where they can be rewound or otherwise manipulated, because all that is required for hardening is cooling or partial cooling. There are a number of techniques to speed the cooling process, such as directing a cold air stream at the extruded material, or passing the substrate over a chilled roller. On the other hand, materials and processing conditions can be chosen so as to allow a short time period after the initial extrusion, typically no more than 60 seconds and preferably less than 30 seconds, during which the thermoplastic polymer is still hot enough for further shaping, such as partial flattening to a desired dimension between two rollers. Thermoplastic polymers may be extruded in one or more beads or straight lines, in patterns of dots, or in other shapes such as an annulus or polygons, depending on the extrusion nozzle. (See for example, the guards 48 of FIGS. 6 and 7.) It is particularly easy to apply a thermoplastic polymer as one or more straight beads to form a section of straight line of 0.5 to 2 cm in length, for example, in the "machine direction," which is the direction the roll is moving as it unwinds and rewinds. (See for example, the guards 48 of FIG. 5.)

Another advantage of using thermoplastic materials for the guards 48 is that the thermoplastic materials do not interfere with the electrical functions of the RFID tags 40.

For many applications, not only is RFID tag durability a requirement, but it is also necessary to have a reliable, simple and rapid manufacturing process that can produce large quantities of RFID tags in a cost-effective manner. One of the most rapid and cost-effective methods to handle labels, tags, partially assembled tags and components (for example, substrates containing an antenna) is in the form of continuous rolls. A continuous roll of RFID tags 40 may have a range of widths from about the width of a single tag to a width of multiple tags, as much as 150 cm. The length of a roll may have a range of lengths from about the length of 20 tags up to as many as about 10,000 tags, or up to 75 m long. Such rolls may be handled in continuous processes, for example, they are unwound, processed, and rewound. These processes may be performed on a roll that is constantly moving at a steady speed, or they may be performed on small sections of roll which are not moving for short periods of time, a so-called step-and-repeat process. Processes that can be performed on rolls moving at a constant speed are preferred, because they are faster than step-and-repeat processes and because step-and-repeat equipment is more complicated and expensive. However, both constantly moving rolls and step-and-repeat rolls are preferred to handling of sheets of tags or individual tags, which is slower and much less cost-effective. The RFID tags 40 of the present invention may be advantageously manufactured using the method describe above to produce a large number of tags 40 with relatively inexpensive costs.

If the RFID tag 40 were attached to a container or object of low to intermediate hardness and modulus, such as rubber, polymer film, or paper, it may be an advantage to select the guard material from materials having greater hardness and modulus than the container or object to which the RFID tag is attached. The relatively stiff guards 48 will under stress embed itself (and the protected integrated circuit) into the relatively pliant surface of the object or container. The integrated circuit 46 protected by the guards 48 will remain relatively unstressed. As another example, if the surface of the object or container is relatively hard with a high modulus, such as metal, the material forming the guards 48 should have a high enough modulus and bond strength to support the expected normal or shear stresses without temporarily or permanently deforming (i.e. straining) to the point that the stress is transmitted directly to the integrated circuit 46 through direct contact.

As illustrated in FIG. 3, the RFID tag 40 may optionally include a first layer of adhesive 52 attached to the second major surface 43 of the substrate 42. The layer of adhesive 52 is useful for attaching the RFID tag 40 to objects, such as tires, cartons, file folders, or passports, as explained below. The RFID tag 40 may also optionally include a liner 54 on the layer of adhesive 52. Suitable liner materials include Polyethylene and silicon coated papers.

As illustrated in FIG. 3, the RFID tag 40 may optionally include a cover layer 50. The cover layer 50 may be directly attached to the guards 48 and the substrate 42, for example, by lamination. Alternatively, the cover layer 50 may be attached to the guards 48 and the substrate 42 by a second layer of adhesive 58, as illustrated in FIG. 4. The cover layer and layer of adhesive 58 are useful for attaching the RFID tag 40 to an article 60. The cover layer 50 may extend beyond the substrate, for example, it might be a tape that is used to affix the RFID tag 40 to an object. Suitable materials for the cover layer 50 include polyester films or papers. Alternatively, the cover layer 50 and layer of adhesive 58 may be commercially available tape sold by 3M Company, based in St. Paul. The cover layer 50 may be printed or patterned with information, for example, a company logo, an advertisement, or information about the object 60 to which the tag 40 is attached. The printed information may specifically include a bar code or other symbolic representation to allow a visual or optical confirmation of the information pertaining to the RFID tag 40. The cover layer may be stapled or otherwise attached to any item. The cover layer may be wrapped around a handle of luggage, for example, and then attached to itself to attach the RFID tag to the luggage.

Suitable adhesives for the first or second layer of adhesives 52, 58 include a wide range of adhesives known to those skilled in the art, including, for example, those based on natural rubber, acrylate polymers, block copolymers, polyolefins and polyolefin copolymers. Pressure-sensitive adhesives may be preferred in some applications.

FIG. 5 illustrates a top view of the RFID tags 40 of FIGS. 3 and 4 with the cover layer 50 removed for clarity. In this embodiment, the guards 48 are rails with a first rail 48a and a second rail 48b, where the integrated circuit 46 is located between the rails 48a, 48b. The guards 48 are substantially parallel to each other and equal distant from the integrated circuit 46. Each rail 48 is made of three different portions 49a, 49b, 49c. However, the guards 48 may each be made of one continuous line extending the same distance as the combination of portions 49a, 49b, 49c. Likewise, the guards 48 could consist of a series of dots forming a similar length over the same distances as the combination of portions 49a, 49b, 49c. Alternatively, the guards 48 may only consist of the two guards adjacent the integrated circuit 46. However, the guard 48 may consist of only one rail 48a adjacent the integrated circuit 46. Regardless, the guards 48 provide one or more high points above the substrate 42 to protect the integrated circuit 46.

FIGS. 6 and 7 illustrate alternative embodiments of the RFID tag 40. In FIG. 6, the guard 48 is in the shape of an annulus or a circle with the integrated circuit 46 located within the annulus. In FIG. 7, the guard is made from a series of three dots located around the integrated circuit 46. Like the guards 48 described above, preferably all of these guards 48 have a height greater than the height of the integrated circuit.

The guards 48 may take many forms or shapes, and be continuous, piece-wise continuous, or discontinuous. The guards may be formed from one or more organic materials. Polymeric materials that are thermoplastic are preferred, and the class of thermoplastic materials known as hotmelt adhesives are more preferred. The guards may also be applied in place onto the flexible substrate 42. The guards 48 may take the form of a dot or pattern of dots, a line or curve or multiple lines or curves, or a polygon or annulus with an open area in the center where the integrated circuit 46 resides. Examples of suitable guards 48 include dots, beads, or lines of a thermoplastic polymer, lines of one or more layers of tape (optionally stacked to achieve the desired dimensions), preformed annuli made from combinations of paper, cloth, or adhesive (such as reinforced punched holes in paper), and preformed molded or cast shapes made of thermoplastic polymers, oligomers or monomers, optionally containing an adhesive layer.

The guards 48 may be preformed shapes attached onto the RFID tags 40. Guards may be placed in one or more steps, as will be apparent to those skilled in the art. The guards 48 may be made of materials that are extruded in rapid roll-to-roll manufacturing processes, but which subsequently cure with no extra processing steps, such as through exposure to ambient moisture. Examples of such materials include adhesive available from 3M Company based in St. Paul, Minn. under the trade name JET-WELD and product number TE-015.

One advantage of using guards 48 in the form of rails is for ease of manufacturing the durable RFID tags 40. If the guards 48 are made from a thermoplastic material, the guards may be extruded onto the RFID tags 40 either individually or continuously where a plurality of RFID tags are presented in a roll form. As the RFID tags 40 move in a machine direction, the rails may be extruded onto the substrates 42. Alternatively, the rail material may be applied using hotmelt or pressure-driven syringe techniques. This technique of manufacturing the RFID tag 40 is simpler and easier to control than the aperture method described above in reference to FIG. 2, where it was necessary to align the aperture over the integrated circuit.

Another advantage of using guards 48 in the form of rails is that the rails do not cover the integrated circuit 46, as the encapsulation or "glob top" method described above in reference to FIG. 1, and thus helps avoid the disadvantages described above. The method of manufacture of the RFID tags 40 is different from the encapsulation or "glob top" method in that the protective structure (the guards 48) are not in contact with, but instead at some distance from the integrated circuit 46 to be protected, which helps avoid the disadvantages described above.

The durable RFID tag 40 is especially designed for use with objects where the RFID tag may experience any number of forces against it, such as when the RFID tag 40 is attached to objects in an industrial environment. For example, the forces may be applied to the surface on which the RFID tag 40 is mounted. The loads may be applied as compressive loads normal to the surface or as shear loads parallel to the surface. These loads may be steady state, such as a dead weight, impulsive, or transitory.

Figure 8:
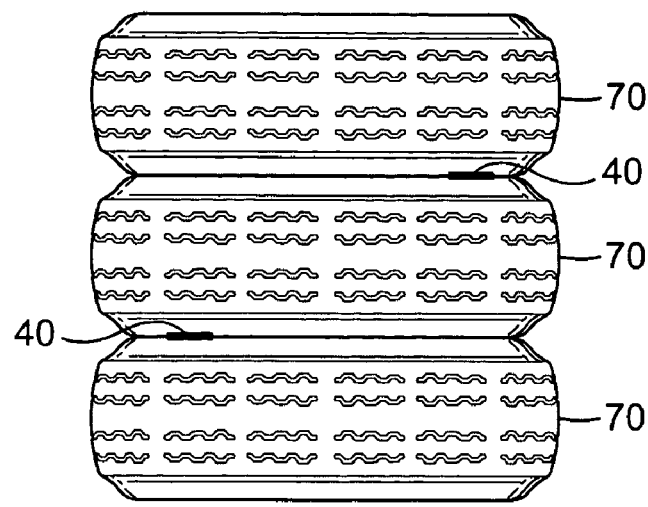
FIG. 8 illustrates a stack of tires with the durable radio frequency identification tag of FIG. 3 compressed between adjacent tires.
Figure 9:
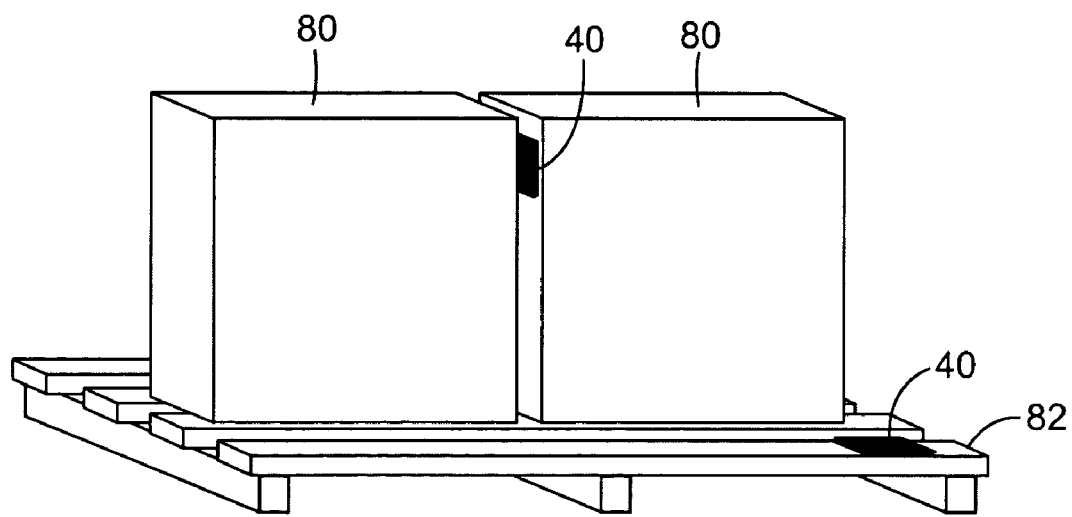
FIG. 9 illustrates a row of boxes on a pallet with the durable radio frequency identification tag of FIG. 3 between the adjacent boxes.

FIGS. 8 and 9 illustrate just two examples of where the durable RFID tag 40 may be applied. The durable RFID tags 40 of the present invention are less susceptible to damage by physical force or impact, as compared to other prior art RFID tags. These forces or impacts may be encountered in applications where the RFID tag 40 may be attached to the outer surface of an object or container. For example, if the RFID tag 40 is attached to an object, such as a tire, the items may be stacked one on another for storage or shipment, as illustrated in FIG. 8. FIG. 8 illustrates a stack of tires 70 with each tire having a durable RFID tag 40 attached to the outer sidewall of the tire 70. The tires 70 may move with respect to one another during shipment. The tires 70 may also receive rough handling during the process of placing them on an automobile. In this position, the durable RFID tags 40 may experience shearing forces, such as when one tire is slid on top of the other tire, or may experience normal forces presented by weight of the tire on top of RFID tag 40. Under either of these conditions, the sensitive, brittle integrated circuit 46 is protected from cracking or breaking by the guards 48 of the RFID tag 40. Alternatively, the RFID tags 40 may be attached to the inside of the tire 70.

Similarly, if the RFID tag 40 is attached to the outside of a shipping container 80, such as a box or carton, the RFID tag is susceptible to impact or abrasion damage from other adjacent containers or from handling equipment such as forklifts. FIG. 9 illustrates use of the durable RFID tags 40 on shipping containers 80, such as boxes or cartons, and on a pallet 82. Shear forces may occur during shipping as cartons or objects are subject to the random vibrations and shocks during the transportation process. Even if the RFID tag 40 is placed inside a shipping container 80, it may still experience impact forces as an item or items inside the container shift during shipping or handling. RFID tags 40 may be placed in positions on carts, large or hand-held equipment or tools, boxes, crates, cartons, totes, luggage, envelopes, books, file folders, or consumer items where physical damage is likely. The durable RFID tag 40 is suited for incorporation directly into thin laminate constructions, including multilayer laminates. The rugged structure will reduce the chance of damage to the RFID tag, if the laminate is used for making cartons or boxes that will be subjected to impact or shear forces during transport. The advantage of the durable RFID tag or label 40 is that it will continue to function during and after normal shipping and handling of the object or container to which they are attached, as compared to a prior art RFID labels where the integrated circuit is more susceptible to damage.

The durable RFID tags 40 may operate at any of several commonly accepted bands in the electromagnetic spectrum, for example 125 KHz, 13.56 MHz, 868–950 MHz, 2.45 GHz, and the like. Stationary or portable RFID interrogator readers, such as the handheld RFID device disclosed in U.S. Pat. No. 6,486,780, "Applications for Radio Frequency Identification Systems," may read the durable RFID tag 40. The RFID tags 40 may be active tags or passive tags.

The operation of the present invention will be further described with regard to the following detailed examples. These examples are offered to further illustrate the various specific and preferred embodiments and techniques. It should be understood, however, that many variations and modifications may be made while remaining within the scope of the present invention.

EXAMPLE 1

Commercially available RFID tags from Texas Instruments of Dallas, Tex., under the trade names TAG-IT ISO and TAG-IT, were used to construct the durable RFID tags of this invention. The antenna of the ISO TAG-IT tags are rectangular in perspective, with dimensions of approximately 22 mm×38 mm. The antennas of the TAG-IT tags are square in perspective, with dimensions of approximately 45 mm on a side. The ISO TAG-IT RFID tag integrated circuit has a dimension of approximately 1 mm square and the TAG-IT RFID tag integrated circuit has a dimension of approximately 1.5 mm square. Each RFID tag was tested to verify RFID function by reading with an RFID reader before modification and subsequent function evaluation.

Two parallel beads of an ethylene vinyl acetate hotmelt adhesive, commercially available from 3M Company of St. Paul, Minn., under the product number of 3764 and trade name JET-MELT, were applied to each of twenty TAG-IT ISO RFID tags. Each bead of the applied adhesive was half-circular in cross-section, with a radius of approximately 1 mm. The beads were approximately 15 mm long and spaced 8 mm apart, with the RFID integrated circuit approximately centered between the beads. Each TAG-IT ISO RFID tag was then laminated to a segment of duct tape that measured 45 mm×100 mm, with the integrated circuit of the TAG-IT ISO RFID tag and the parallel beads adjacent to the adhesive layer of the duct tape, thus forming one example of the durable RFID tag of this invention. The RFID tag was positioned so that the geometric center of the RFID tag was approximately coincident with the geometric center of the section of duct tape, and the long axis of the RFID tag was parallel to the long axis of the section of duct tape. The edges of the tape adhesive extended beyond the RFID tag along each edge. The duct tape used is commercially available from 3M Company as colored duct tape, under the trade name SCOTCH and model number 330.

The durable RFID tag constructed as above described was then attached by the duct tape to the outside surface of a section of an automobile tire sidewall cut from the sidewall of a typical passenger car radial tire. The sidewall section was approximately an isosceles trapezoid, with the dimensions of 130 mm (short side)×170 mm (long side)×100 mm (height). A static load was then applied to the durable RFID tag attached to the tire sidewall section in a hydraulic press commercially available from Wabash Method Products, Inc. of Wabash, Ind., and model number 50-1818-2TMX.

To conduct the static load test, the durable RFID tag attached to the tire sidewall section was placed between the platens of the hydraulic press. A second tire sidewall section, of approximately the same dimensions as the first, was laid on the sample. The outer surfaces of the tire sidewall sections were placed in direct apposition, with the durable RFID tag between the apposed outer surfaces of the tire sidewall sections. The press was closed and held at each of the pressures listed below in Table 1 for 15 seconds.

A second static load test was conducted in which only sections of tire sidewall with an attached durable RFID tag was placed into the press. In this static load test, the steel platen of the press was brought into direct contact with the durable RFID tag.

For a comparative example (designated as CE1), a standard commercially available Texas Instruments TAG-IT RFID tags were individually laminated to a section of duct tape, with the integrated circuit side of the TAG-IT RFID tag adjacent to the adhesive of the duct tape. The comparative example tags were then attached by the duct tape to a tire sidewall section of the same type and dimensions as stated above.

The results of the static load tests are reported in Table 1. No durable RFID tag of the present invention failed under static loads as high as 2.9 MPa (2.9 MPa is equivalent to 430 psi) in which the durable RFID tag was apposed by a second tire sidewall section. No durable RFID tag failed the second static load test of up to 2.9 MPa applied directly by the steel press platen.

In contrast, the comparative example Texas Instruments TAG-IT tags failed when subjected to as little as 0.58 MPa (86 psi). The failed comparative example Texas Instrument TAG-IT tags were replaced with functional Texas Instrument TAG-IT tags and tested at the higher pressure of 2.9 MPa (430 psi). Each comparative Texas Instrument TAG IT tag tested at the higher pressure of 2.9 MPa (430 psi) also failed. Failure meant that a tag could no longer be read by an RFID reader or interrogator.

by reading with an RFID reader before modification and subsequent function evaluation.

Two parallel beads of an ethylene vinyl acetate hotmelt adhesive, commercially available from 3M Company of St. Paul, Minn., under the product number of 3764 and trade name JET-MELT, were applied to each of ten TAG-IT ISO RFID tags. Each bead of the applied adhesive was half-circular in cross-section, with a radius of approximately 1 mm. The beads were approximately 15 mm long and spaced 8 mm apart, with the RFID integrated circuit approximately centered between the beads. Each TAG-IT ISO RFID tag was then laminated to a segment of duct tape that measured 45 mm×100 mm, with the integrated circuit of the TAG-IT ISO RFID tag and the parallel beads adjacent to the adhesive layer of the duct tape, thus forming one example of the durable RFID tag of this invention. The RFID tag was positioned so that the geometric center of the RFID tag was approximately coincident with the geometric center of the section of duct tape, and the long axis of the RFID tag was parallel to the long axis of the section of duct tape. The edges of the tape adhesive extended beyond the RFID tag along each edge.

For comparative examples (designated as CE2–CE11), ten TAG-IT RFID tags were made without the protective bead structures. Each comparative example Texas Instruments TAG-IT RFID tag was laminated to a piece of duct tape with dimensions of 45 mm×100 mm, with the adhesive side of the tape facing the surface of the tag containing the RFID integrated circuit. The TAG-IT RFID comparative example tags were positioned so that the geometric center of the RFID tag was approximately coincident with the geometric center of the section of duct tape, and the long axis of the RFID tag was parallel to the long axis of the section of duct tape. The edges of the tape adhesive extended

TABLE 1

Durable RFID Tag and Performance After Application of a Static Load.

| Sample number | 0.29 MPa (43 psi) | | 0.58 MPa (86 psi) | | 2.9 MPa (430 psi) | |
| --- | --- | --- | --- | --- | --- | --- |
| | tire section | metal platen | tire section | metal platen | tire section | metal platen |
| 1 | reads ok | reads ok | reads ok | reads ok | reads ok | reads ok |
| 2 | reads ok | reads ok | reads ok | reads ok | reads ok | reads ok |
| 3 | reads ok | reads ok | reads ok | reads ok | reads ok | reads ok |
| 4 | reads ok | reads ok | reads ok | reads ok | reads ok | reads ok |
| CE1 | reads ok | reads ok | failed | failed | failed | failed |

EXAMPLE 2

Performance of the durable RFID tags was next assessed under impact loads. The durable RFID tag was evaluated in a drop test to simulate impact loads that a durable RFID tag might be exposed to when attached to a container such as a cardboard box during shipment by common carrier or handling in a warehouse or other similar conditions in industrial environments.

Durable RFID tags were constructed as described in Example 1. Commercially available RFID tags from Texas Instruments of Dallas, Tex., under the trade name TAG-IT, were used to construct the durable RFID tags of this invention. The antenna of the TAG-IT tags used for the impact load test are rectangular in perspective, with dimensions of approximately 22 mm×38 mm. The TAG-IT RFID tag integrated circuit has a dimension of approximately 1.5 mm square. Each RFID tag was tested to verify RFID function beyond the RFID tag along each edge, so that the thus formed RFID tag with duct tape laminate comprised an RFID tag.

The RFID labels as constructed per the above description were then adhered to cardboard substrates using the exposed area of the duct tape adhesive. The cardboard substrates used were sections of corrugated cardboard box material with dimensions of 70 mm×140 mm. The corrugated cardboard box substrates were cut from single-wall cardboard boxes, rated at 200 psi (1.38 MPa) burst strength, with unfinished brown kraft paper face stock. The total thickness of the cardboard was 4 mm. The substrates were cut with the internal corrugations parallel to the long (140 mm) edge of the substrate.

The RFID labels were positioned on the corrugated cardboard box substrates, so that the RFID die was centered approximately 70 mm from the short edge and located approximately 35 mm±5 mm from the long edge. The variation in the position from the long edge was due to the chosen impact test criteria that the integrated circuit be located above the ridge formed by the internal corrugation closest to the centerline of the corrugated cardboard box section.

The drop test was performed using a free-falling mass of 540 grams, comprised of two galvanized steel pipe nipples, one pipe nipple ½ inch×4 inch (12.5 mm×102 mm) long, the other pipe nipple 1 inch×4 inch (25.4 mm×102 mm) long. A ½ inch 13×6 inch (12.5 mm—13 threads per 25.4 mm) bolt running through the center, ½ inch washers (12.5 mm), and a ½–13 (12.5 mm—13 threads per 25.4 mm) nut to hold the components together. The circular face of the bolt head provided a smooth flat impact surface of 18 mm diameter. The mass was aligned above the target substrate, with the bolt head pointing down. The alignment and height of the free-falling mass were determined by a polycarbonate tube attached to a fixed stand. The inner diameter of the polycarbonate tube was just large enough to fit the outer diameter of the free-falling mass. The mass was manually positioned in the polycarbonate tube and allowed to free fall 250 mm to strike the sample (RFID label on cardboard substrate) under test. The sample under test was supported by a 3 mm (⅛ inch) thick steel plate.

Under these conditions, the falling mass attained 1.32 J kinetic energy. Assuming that this energy was dissipated by uniform compression of the 4 mm thick cardboard substrate, the force of impact was approximately 331 N. Under this assumption, it is calculated that an instantaneous effective pressure of approximately 1.29 MPa (188 psi) distributed over the 18 mm diameter of the circular bolt head face was delivered. As shown in Table 2, this impact value rendered unprotected RFID labels inoperable. It should be noted that the applied impact pressure of 1.29 MPa (188 psi) is within the burst strength limits of the corrugated cardboard used for the test substrates.

Each of the twenty samples (ten durable RFID labels on corrugated cardboard substrates, ten comparative example on corrugated cardboard substrates) was positioned in turn on the steel plate. The free-falling mass was dropped once onto each sample under test, with the point of impact centered approximately on the RFID integrated circuit. After the drop test, the tag's RFID function was checked with a hand-held RFID Reader programmed for the Texas Instruments TAG-IT product. RFID labels that failed to read were recorded as "fail", i.e., "did not read". If the RFID labels were successfully read, then it was recorded as "reads ok".

Of the ten durable RFID tags, nine survived the drop test. Of the ten comparative example RFID tags, one survived the drop test. The results are summarized in Table 2.

TABLE 2

| Drop Test Results | |
|---|---|
| Sample | Drop Test |
| 5 | reads ok |
| 6 | reads ok |
| 7 | reads ok |
| 8 | reads ok |
| 9 | reads ok |
| 10 | reads ok |
| 11 | reads ok |
| 12 | fail |
| 13 | reads ok |
| 14 | reads ok |
| CE2 | fail |
| CE3 | fail |

TABLE 2-continued

| Drop Test Results | |
|---|---|
| Sample | Drop Test |
| CE4 | fail |
| CE5 | fail |
| CE6 | fail |
| CE7 | fail |
| CE8 | reads ok |
| CE9 | fail |
| CE10 | fail |
| CE11 | fail |

The tests and test results described above are intended solely to be illustrative, rather than predictive, and variations in the testing procedure can be expected to yield different results.

The present invention has now been described with reference to several embodiments thereof. The foregoing detailed description and examples have been given for clarity of understanding only. No unnecessary limitations are to be understood therefrom. All patents and patent applications cited herein are hereby incorporated by reference. It will be apparent to those skilled in the art that many changes can be made in the embodiments described without departing from the scope of the invention. Thus, the scope of the present invention should not be limited to the exact details and structures described herein, but rather by the structures described by the language of the claims, and the equivalents of those structures.

What is claimed is:

1. A durable radio frequency identification tag, comprising:
    a flexible substrate including a first major surface and a second major surface opposite the first major surface;
    a radio frequency identification antenna attached to the first major surface of the substrate;
    an integrated circuit attached to the antenna; and
    a thermoplastic guard attached to the flexible substrate adjacent the integrated circuit.

2. The durable radio frequency identification tag of claim 1, further comprising a first layer of adhesive attached to the substrate.

3. A pallet in combination with a durable radio frequency identification tag of claim 2, wherein the first layer of adhesive attaches the durable radio frequency identification tag to the pallet.

4. A box in combination with a durable radio frequency identification tag of claim 2, wherein the first layer of adhesive attaches the durable radio frequency identification tag to the box.

5. The box in combination with a durable radio frequency identification tag of claim 4, wherein the durable radio frequency identification tag is attached to an outside surface of the box.

6. The box in combination with a durable radio frequency identification tag of claim 4, wherein the durable radio frequency identification tag is attached to an inside surface of the box.

7. A passport in combination with a durable radio frequency identification tag of claim 2, wherein the layer of adhesive attaches the durable radio frequency identification tag to the passport.

8. A document in combination with a durable radio frequency identification tag of claim 2, wherein the layer of adhesive attaches the durable radio frequency identification tag to the document.

9. The durable radio frequency identification tag of claim 1, wherein the integrated circuit has a first height measured from the first major surface of the flexible substrate, and wherein the thermoplastic guard has a second height measured from the first major surface of the flexible substrate, and wherein the second height is greater than the first height.

10. The durable radio frequency identification tag of claim 9, wherein the second height is at least 1.25 times larger than the first height.

11. The durable radio frequency identification tag of claim 1, wherein the guard does not extend over the integrated circuit attached to the flexible substrate.

12. The durable radio frequency identification tag of claim 1, wherein the thermoplastic guard is comprised of a first rail and a second rail, wherein the first rail and second rail are substantially parallel to each other with the integrated circuit located between the first rail and second rail.

13. The durable radio frequency tag of claim 12, wherein the first rail and second rail are continuous lines.

14. The durable radio frequency tag of claim 12, wherein the first rail and second rail are made from a plurality of portions.

15. The durable radio frequency identification tag of claim 1, wherein the thermoplastic guard is in the shape of an annulus, and wherein the integrated circuit is located within the annulus.

16. The durable radio frequency identification tag of claim 1, wherein the thermoplastic guard is made from a plurality of sections, and wherein the sections are arranged to form a shape of an annulus, and wherein the integrated circuit is located within the annulus.

17. The durable radio frequency identification tag of claim 1, wherein the thermoplastic guard is in the shape of a polygon, and wherein the integrated circuit is located within the polygon.

18. The durable radio frequency identification tag of claim 1, wherein the thermoplastic guard is made from a plurality of sections, wherein the sections are arranged to form a shape of a polygon, and wherein the integrated circuit is located within the polygon.

19. The durable radio frequency identification tag of claim 1, wherein the flexible substrate has an overall thickness of between 25 microns and 100 microns.

20. The durable radio frequency identification tag of claim 1 further comprising a flexible cover layer attached to the thermoplastic guard and to the substrate.

21. The durable radio frequency identification tag of claim 20 further comprising a second layer of adhesive between the flexible cover layer and the flexible substrate.

22. The durable radio frequency identification tag of claim 1, wherein pressure of at least at about 1 MPa is applied to the durable radio frequency identification tag adjacent the thermoplastic guard, and subsequently the integrated circuit may be read by an interrogator.

23. The durable radio frequency identification tag of claim 1 further comprising a liner attached to the first layer of adhesive opposite the substrate.

24. A tire in combination with the durable radio frequency identification tag of claim 1, wherein a layer of adhesive attaches the durable radio frequency identification tag to a tire.

25. The tire in combination with the durable radio frequency identification tag of claim 24, wherein the durable radio frequency identification tag is attached to an outer sidewall of the tire.

26. A passport in combination with a durable radio frequency identification tag of claim 1, wherein the durable radio frequency identification tag further comprises a flexible cover layer, wherein the flexible cover attaches the durable radio frequency identification tag to the passport.

27. A continuous roll of durable radio frequency tags, wherein a plurality of durable radio frequency tags of claim 1 are attached to one another.

28. The roll of durable radio frequency identification tags of claim 27, wherein the thermoplastic guard is comprised of a first rail and a second rail, wherein the first rail and second rail are substantially parallel to the length of the roll.

29. The durable radio frequency identification tag of claim 1, wherein the thermoplastic guard is attached to the flexible substrate and to the radio frequency identification antenna.

30. A durable radio frequency indentification tag, comprising:
    a flexible substrate including a first major surface and a second major surface opposite the first major surface;
    a radio frequency indentification antenna attached to the first major surface of the substrate;
    an integrated circuit attached to the durable radio frequency indentification tag; and
    a thermoplastic guard attached to the flexible subtrate adjacent the integrated circuit;
    wherein an interrogator may read the integrated circuit after a pressure of at least 1 MPa is applied to the durable radio frequency identification tag.

31. The durable radio frequency identification tag of claim 30, wherein the integrated circuit has a first height measured from the first major surface of the flexible substrate, and wherein the thermoplastic guard has a second height measured from the first major surface of the flexible substrate, and wherein the second height is greater than the first height.

32. The durable radio frequency identification tag of claim 31, wherein the second height is at least 1.25 times larger than the first height.

33. The durable radio frequency identification tag of claim 30, wherein the guard does not extend over the integrated circuit attached to the flexible substrate.

34. The durable radio frequency identification tag of claim 30, wherein the thermoplastic guard is comprised of a first rail and a second rail, wherein the first rail and second rail are substantially parallel with the integrated circuit located between the first rail and second rail.

35. The durable radio frequency tag of claim 34, wherein the first rail and second rail are continuous lines.

36. The durable radio frequency tag of claim 34, wherein the first rail and second rail are made from a plurality of portions.

37. The durable radio frequency identification tag of claim 30, wherein the thermoplastic guard is in the shape of an annulus, and wherein the integrated circuit is located within the annulus.

38. The durable radio frequency identification tag of claim 30, wherein the thermoplastic guard is made from a plurality of sections, and wherein the sections are arranged to form a shape of an annulus, and wherein the integrated circuit is located within the annulus.

39. The durable radio frequency identification tag of claim 30, wherein the thermoplastic guard is in the shape of a polygon, and wherein the integrated circuit is located within the polygon.

40. The durable radio frequency identification tag of claim 30, wherein the thermoplastic guard is made from a plurality of sections, and wherein the sections are arranged to form a shape of a polygon, and wherein the integrated circuit is located within the polygon.

41. The durable radio frequency identification tag of claim 30, wherein the flexible substrate has a thickness of between 25 microns and 100 microns.

42. The durable radio frequency identification tag of claim 30 further comprising a first layer of adhesive attached to the substrate.

43. The durable radio frequency identification tag of claim 42 further comprising a liner attached to the first layer of adhesive opposite the substrate.

44. A box in combination with a durable radio frequency identification tag of claim 43, wherein the durable radio frequency identification tag is attached to an inside surface of the box.

45. A box in combination with a durable radio frequency identification tag of claim 42, wherein the durable radio frequency identification tag is attached to an outside surface of the box.

46. A passport in combination with a durable radio frequency identification tag of claim 42, wherein the layer of adhesive attaches the durable radio frequency identification tag to the passport.

47. A document in combination with a durable radio frequency identification tag of claim 42, wherein the layer of adhesive attaches the durable radio frequency identification tag to the document.

48. The durable radio frequency identification tag of claim 30 further comprising a flexible cover layer attached to the thermoplastic guard and to the flexible substrate.

49. The durable radio frequency identification tag of claim 30 further comprising a second layer of adhesive between the flexible cover layer and the flexible substrate.

50. A tire in combination with the durable radio frequency identification tag of claim 30, wherein a layer of adhesive attaches the durable radio frequency identification tag to a tire.

51. The tire in combination with the durable radio frequency identification tag of claim 29, wherein the durable radio frequency identification tag is attached to the outer sidewall of the tire.

52. A pallet in combination with a durable radio frequency identification tag of claim 30, wherein a layer of adhesive attaches the durable radio frequency identification tag to the pallet.

53. A box in combination with a durable radio frequency identification tag of claim 30, wherein a layer of adhesive attaches the durable radio frequency identification tag to the box.

54. The durable radio frequency identification tag of claim 30, wherein the thermoplastic guard is attached to the flexible substrate and to the radio frequency identification antenna.

55. A method of manufacturing a durable radio frequency identification tag, comprising the steps of:

providing a flexible substrate containing an antenna on at least one surface of the flexible substrate;

attaching an integrated circuit to the antenna; and extruding a thermoplastic guard onto the substrate adjacent the integrated circuit.

56. The method of claim 55 further comprising the step of:

forming a roll of durable radio frequency tags.

57. The method of claim 56 as wherein the extruding step includes extruding a thermoplastic guard comprising at least two rails in a direction parallel to the direction of unwinding and winding of the roll.

58. A durable radio frequency identification tag made by the method of claim 55.

59. The method of claim 55, further including the step of:

applying a layer of adhesive on the flexible substrate.

60. The method of claim 59, further including the step of:

providing a liner and attaching the durable radio frequency identification tag to the liner with the layer of adhesive.

61. The method of claim 55, wherein the extruding step includes extruding the thermoplastic guard onto the substrate and the radio frequency identification antenna.

* * * * *

UNITED STATES PATENT AND TRADEMARK OFFICE
CERTIFICATE OF CORRECTION

PATENT NO. : 7,259,678 B2
APPLICATION NO. : 10/730345
DATED : August 21, 2007
INVENTOR(S) : Katherine A. Brown et al.

It is certified that error appears in the above-identified patent and that said Letters Patent is hereby corrected as shown below:

On Title Page

Page 2, Column 2 Item 56 under "Other Publications",
Line 8, delete "articlereview" and insert -- articleview --.

Column 22,
Line 20, delete "indentification" and insert -- identification --.
Line 24, delete "indentification" and insert -- identification --.
Line 27, delete "indentification" and insert -- identification --.
Line 28, delete "subtrate" and insert -- substrate --.

Column 23,
Line 42, delete "claim 29," and insert -- claim 30 --.

Signed and Sealed this

Twenty-seventh Day of November, 2007

JON W. DUDAS
*Director of the United States Patent and Trademark Office*